United States Patent
Moore et al.

(10) Patent No.: US 7,003,619 B1
(45) Date of Patent: Feb. 21, 2006

(54) MEMORY DEVICE AND METHOD FOR STORING AND READING A FILE SYSTEM STRUCTURE IN A WRITE-ONCE MEMORY ARRAY

(75) Inventors: Christopher S. Moore, San Jose, CA (US); James E. Schneider, Los Angeles, CA (US); J. James Tringali, Los Altos, CA (US); Roger W. March, Santa Clara, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 467 days.

(21) Appl. No.: 09/877,719

(22) Filed: Jun. 8, 2001

Related U.S. Application Data

(60) Provisional application No. 60/282,723, filed on Apr. 9, 2001, provisional application No. 60/282,790, filed on Apr. 9, 2001.

(51) Int. Cl.
*G11C 7/00* (2006.01)
*G11C 11/34* (2006.01)

(52) U.S. Cl. ............... 711/102; 711/100; 711/103; 711/108; 711/154; 711/4; 707/202; 707/203; 369/47.27; 369/47.34; 714/746; 714/747; 365/185.33; 365/185.29; 365/185.14; 365/189.01; 365/185.15; 365/234; 365/236

(58) Field of Classification Search ........ 711/102–103, 711/115, 4, 100, 108, 154, 156; 707/202–203; 369/47.1, 47.27, 47.34, 13.01; 714/746–747; 365/185.33, 185.29, 185.14–185.15, 189.01, 365/234, 236
See application file for complete search history.

(56) References Cited

U.S. PATENT DOCUMENTS

| | | | |
|---|---|---|---|
| 4,646,266 A | 2/1987 | Ovshinsky et al. | |
| 4,682,318 A | 7/1987 | Busby | |
| 4,691,299 A | 9/1987 | Rivest et al. | |
| 4,740,890 A | 4/1988 | William | |
| 5,029,125 A | 7/1991 | Sciupac | |
| 5,040,110 A * | 8/1991 | Miki et al. | 707/200 |

(Continued)

FOREIGN PATENT DOCUMENTS

EP    1 168 150 A1    2/2002

(Continued)

OTHER PUBLICATIONS

"New Direct CD 2.5 Improves Speed and Reliability of Data Archiving Using CD-R/CD-RW," http://www.adaptec.com/worl . . . pany/pressrelease.html?prodkey=08051998, 2 pages, Aug. 5, 1998.

(Continued)

*Primary Examiner*—B. James Peikari
*Assistant Examiner*—Zhuo H. Li
(74) *Attorney, Agent, or Firm*—Brinks Hofer Gilson & Lione

(57) ABSTRACT

The preferred embodiments described herein provide a memory device and method for storing and reading a file system structure in a write-once memory array. In one preferred embodiment, a plurality of bits representing a file system structure is inverted and stored in a write-once memory array. When the inverted plurality of bits is read from the memory array, the bits are inverted to provide the file system structure bits in their original, non-inverted configuration. With this preferred embodiment, a file system structure can be updated to reflect data stored in the memory array after the file system structure was written. Other preferred embodiments are provided, and each of the preferred embodiments described herein can be used alone or in combination with one another.

34 Claims, 12 Drawing Sheets

U.S. PATENT DOCUMENTS

| | | | |
|---|---|---|---|
| 5,119,291 A | | 6/1992 | Flannagan et al. |
| 5,247,494 A | * | 9/1993 | Ohno et al. .............. 369/13.02 |
| 5,261,072 A | | 11/1993 | Siegel |
| 5,307,497 A | | 4/1994 | Feigenbaum et al. |
| 5,321,824 A | | 6/1994 | Burke et al. |
| 5,437,012 A | | 7/1995 | Mahajan |
| 5,437,028 A | | 7/1995 | Iijima |
| 5,448,728 A | | 9/1995 | Takano et al. |
| 5,457,796 A | | 10/1995 | Thompson |
| 5,463,772 A | | 10/1995 | Thompson et al. |
| 5,475,820 A | | 12/1995 | Natrasevschi et al. |
| 5,537,652 A | | 7/1996 | Friedl et al. |
| 5,559,778 A | | 9/1996 | Inokuchi et al. |
| 5,590,320 A | * | 12/1996 | Maxey ...................... 707/203 |
| 5,630,093 A | | 5/1997 | Holzhammer et al. |
| 5,752,005 A | | 5/1998 | Jones |
| 5,761,700 A | | 6/1998 | Cozart et al. |
| 5,761,741 A | | 6/1998 | Robbins et al. |
| 5,832,263 A | | 11/1998 | Hansen et al. |
| 5,835,396 A | | 11/1998 | Zhang |
| 5,890,169 A | | 3/1999 | Wong et al. |
| 6,000,023 A | | 12/1999 | Jeon |
| 6,034,882 A | | 3/2000 | Johnson et al. |
| 6,055,180 A | | 4/2000 | Gudesen et al. |
| 6,073,208 A | | 6/2000 | Norman |
| 6,104,635 A | | 8/2000 | Ogane |
| 6,138,203 A | | 10/2000 | Inokuchi et al. |
| 6,185,122 B1 | | 2/2001 | Johnson et al. |
| 6,236,587 B1 | | 5/2001 | Gudesen et al. |
| 6,341,085 B1 | | 1/2002 | Yamagami et al. |
| 6,345,333 B1 | | 2/2002 | Sassa et al. |
| 6,351,838 B1 | | 2/2002 | Amelia |
| 6,370,642 B1 | | 4/2002 | Chiang et al. |
| 6,377,526 B1 | * | 4/2002 | Vining et al. .............. 369/53.1 |
| 6,424,581 B1 | | 7/2002 | Bosch et al. |
| 6,490,703 B1 | * | 12/2002 | de la Iglesia et al. ...... 714/746 |
| 6,563,745 B1 | * | 5/2003 | Ilkbahar ................ 365/189.07 |
| 6,584,541 B1 | | 6/2003 | Friedman et al. |
| 6,598,135 B1 | | 7/2003 | MacLeod |
| 6,631,107 B1 | | 10/2003 | Ito et al. |
| 6,647,471 B1 | | 11/2003 | March et al. |
| 6,658,438 B1 | | 12/2003 | Moore et al. |
| 6,667,939 B1 | | 12/2003 | Miyamoto |
| 6,772,274 B1 | | 8/2004 | Estakhri |
| 2002/0034105 A1 | | 3/2002 | Kulkarni et al. |
| 2002/0107862 A1 | | 8/2002 | Moore et al. |
| 2002/0108054 A1 | | 8/2002 | Moore et al. |
| 2003/0120858 A1 | | 6/2003 | March et al. |

FOREIGN PATENT DOCUMENTS

| | | |
|---|---|---|
| EP | 1 331 548 A2 | 7/2003 |
| EP | 1 359 500 A2 | 11/2003 |
| JP | 407045085 * | 2/1995 |
| JP | 410283717 A | 10/1998 |
| WO | WO 99/14763 | 8/1998 |

OTHER PUBLICATIONS

"Universal Disk Format (UDF) Driver," http://www.trylinux.com/projects/udf/index.html, 3 pages (1999).

"FAT File Allocation Table," http://www.easydesksoftware.com/fat.htm, 2 pages, Oct. 24, 1999.

"FAT File Allocation Table," http://www.oreilly.com/reference/directory/terms/F/File_Allocation_Table.htm, 4 pages (1996).

"ISO9960 Simplified for DOS/Windows by Philip J. Erdelsky," http://www.alumni.caltech.edu/~pje/iso9660.html, 8 pages Aug. 26, 2000.

"Memory cards: designing with a full deck," http://www.ednmag.com/ednmag/reg/2000/052520000/11dfl.htm, 12 pages, May 25, 2000.

"DOS Disk Formats," http://www.qvctc.commnet.edu/classes/csc277/formats.html, 7 pages (1999).

"MS-DOS Partitioning Summary," http://www.qvctc.commnet.edu/classes/csc277/fdisk2.html, 3 pages (1999).

"DOS Partitions," http://www.qvctc.commnet.edu/classes/csc277/partitions.html, 5 pages (1999).

"DOS Disk Structures-Definitions," http://www.qvctc.commnet.edu/classes/csc277/formats2.html, 3 pages (1999).

"MS-DOS Summary A Survival Guide," http://www.washtenaw.cc.mi.us/dept/cis/mod/q02cd.htm, 10 pages (1996).

"Hardware White Paper, FAT: General Overview of On-Disk Format," Microsoft Corp., 25 pages, May 5, 1999.

"Method for Deleting Stored Digital Data from Write-Once Memory Device," U.S. Appl. No. 09/638,439, filed Aug. 14, 2000; inventors: Christopher S. Moore, Derek J. Bosch, Daniel C. Steere, and J. James Tringali.

"Method for Storing Digital Information in Write-Once Memory Array," U.S. Appl. No. 09/727,229, filed Nov. 30, 2000; inventors: David R. Friedman Derek J. Bosch, Christopher S. Moore, J. James Tringali, and Michael A. Vyyoda.

"Three-Dimensional Memory Array and Method of Fabrication," U.S. Appl. No. 09/560,626, filed Apr. 28, 2000; inventor: Johan Knall.

"Write-Once Memory Array Controller, System, and Method," U.S. Appl. No. 09/638,427, filed Aug. 14, 2000; inventors: Derek J. Bosch, Christopher S. Moore, Daniel C. Steere, and J. James Tringali.

"Low-Cost Three-Dimensional Memory Array," U.S. Appl. No. 09/638,428, filed Aug. 14, 2000; inventors: Mark G. Johnson, Thomas H. Lee, Vivek Subramanian, and P. Michael Farmwald.

"Modular Memory Device," U.S. Appl. No. 09/638,334, filed August 14, 2000; inventors: J. James Tringali, P. Michael Farmwald, Thomas H. Lee, Mark G. Johnson, and Derek J. Bosch.

"The MS-DOS Filesystem," http://www.cs.adfa.oz.au/teaching/studinfo/osrts/Lectures/node113.html, 2 pages Mar. 1, 2001.

"comp.os.ms-windows.programmer.vxd Frequently Asked Questions (FAQ)," http://www.faqs.org/faqs/windows/programming/vxd/, 16 pages (1995).

"CD-ROM Driver Installation Procedure," http://www.pcguide.com/proc/setup/cddriver-c.html, 3 pages, Apr. 17, 2001.

"Fujifilm News & Events, Medical Imaging Science Systems NDT Systems," http://www.fujimed.com/news/news_openarch.html, 2 pages, Nov. 26, 2000.

"CNN.com DVD Encryption hacked," http://www.cnn.com/TECH/computing/9911/05/dvd.hack.idg/, 3 pages, Nov. 5, 1999.

"Octopus Systems, Acorn's Solution for the Java™ Technology Platform," http://www.octosys.co.uk/java.html, 9 pages (2001).

"Content Protection System Architecture, A Comprehensive Framework for Content Protection Intel Corp.," 19 pages, Feb. 17, 2000.

"Media security thwarts temptation, permits prosecution," http://www.ednmag.com/ednmag/reg/2000/06222000/13tt.htm, 13 pages, Jun. 22, 2000.

"Memory Devices and Methods for Use Therewith," U.S. Appl. No. 09/748,589, filed Dec. 22, 2000; inventors: Roger W. March, Christopher S, Moore, Daniel Brown, Thomas H. Lee, and Mark H. Johnson.

"Solid-State Memory Device Stroing Program Code and Methods for Use Therewith," U.S. Appl. No. 09/775,745, filed Feb. 2, 2001; inventors: Christopher Moore, Roger March, and Dan Brown.

"Memory Device and Method for Reading Data Stored in a Portion of a Memory Device Unreadable by a File System of a Host Device," U.S. Appl. No. 09/775,939, filed Feb. 2, 2001; inventors: Christopher Moore, Roger March, and Dan Brown.

"Memory Device and Method for Storing and Reading Data in a Write-Once Memory Array," U.S. Appl. No. 09/877,720, filed Jun. 8, 2001; inventors: Christopher S. Moore, James E. Schneider, J. James Tringali, and Roger W. March.

"Method for Reading Data in a Write-Once Memory Device Using a Write-Many File System," U.S. Appl. No. 09/878,138, filed Jun. 8, 2001; Christopher S. Moore, J. James Tringali, Roger W. March, James E. Schneider, Derek J. Bosch, and Daniel C. Steere.

"Method for Re-Directing Data Traffic in a Write-Once Memory Device," U.S. Appl. No. 09/877,691, filed Jun. 8, 2001; inventors: J. James Tringali, Christopher S. Moore, Roger W. March, James E. Schneider, Derek J. Bosch, and Daniel C. Steere.

"Exotic Memories, Diverse Approaches," EDN Asia, pp. 22-33 (Sep. 2001).

"A Vertical Leap for Microchips," Thomas H. Lee, Scientific American, 8 pages (Jan. 2002; printed Dec. 10, 2001).

"SmartMedia Physical Format Specifications Version 1.30," SSFDC Forum Technical Committee, 23 pages (May 19, 2000).

"SmartMedia Electrical Specifications Version 1.30," SSFDC Forum Technical Committee, 23 pages (May 19, 2000).

Press Release. "DataPlay, Inc.—What's Playing on DataPlay . . . Everything Digital!," 2 Pages, Jan. 7, 2002.

"How Does TrueFFS Manage Wear Leveling," http://www.m-sys.com/content/information/calcInfo.asp, 2 pages, Oct. 2001.

"Datalight FlashFX 4.06," User's Guide, p. 11, Aug. 2000.

"How Flash Memory Works," http://howstuffworks.com/flash-memory.htm?printable=1, 5 pages, Sep. 2001.

"Flash Memory," Samsung Electronics, 39 pages, Jul. 2004.

"Chapter 32—Disk Concepts and Troubleshooting," Microsoft Windows 2000 Professional Resource Kit, Microsoft Corporation, 29 pages, Mar. 15, 2000.

Danny Dolev et al.; Correcting faults in write-once memory; annual ACM Symposium on Theory of Computing archiveProceedings of the sixteenth annual ACM symposium on Theory of computing; pp: 225-229; 1984; ISBN:0-89791-133-4.

Ronald L. Rivest, Adi Shamir; How to reuse a "write-once" memory (Preliminary Version); May 1982; Proceedings of the fourteenth annual ACM symposium on Theory of computing; pp.:105-113; ISBN:0-89791-070-2.

Zemor, G. and Cohen, G.D.: Error-correcting WOM-codes; Information Theory, IEEE Transactions on; May 1991; vol.: 37 Issue: 3, Part 2; pp.: 730-734; ISSN: 0018-9448.

NN8803151, IBM Technical Disclosure Bulletin, "Incremental Directory Indexes for Write Once Media," Mar., 1988, vol. 30, Issue 10, pp. 151-155.

* cited by examiner

Fig. 7  Fig. 8  Fig. 9

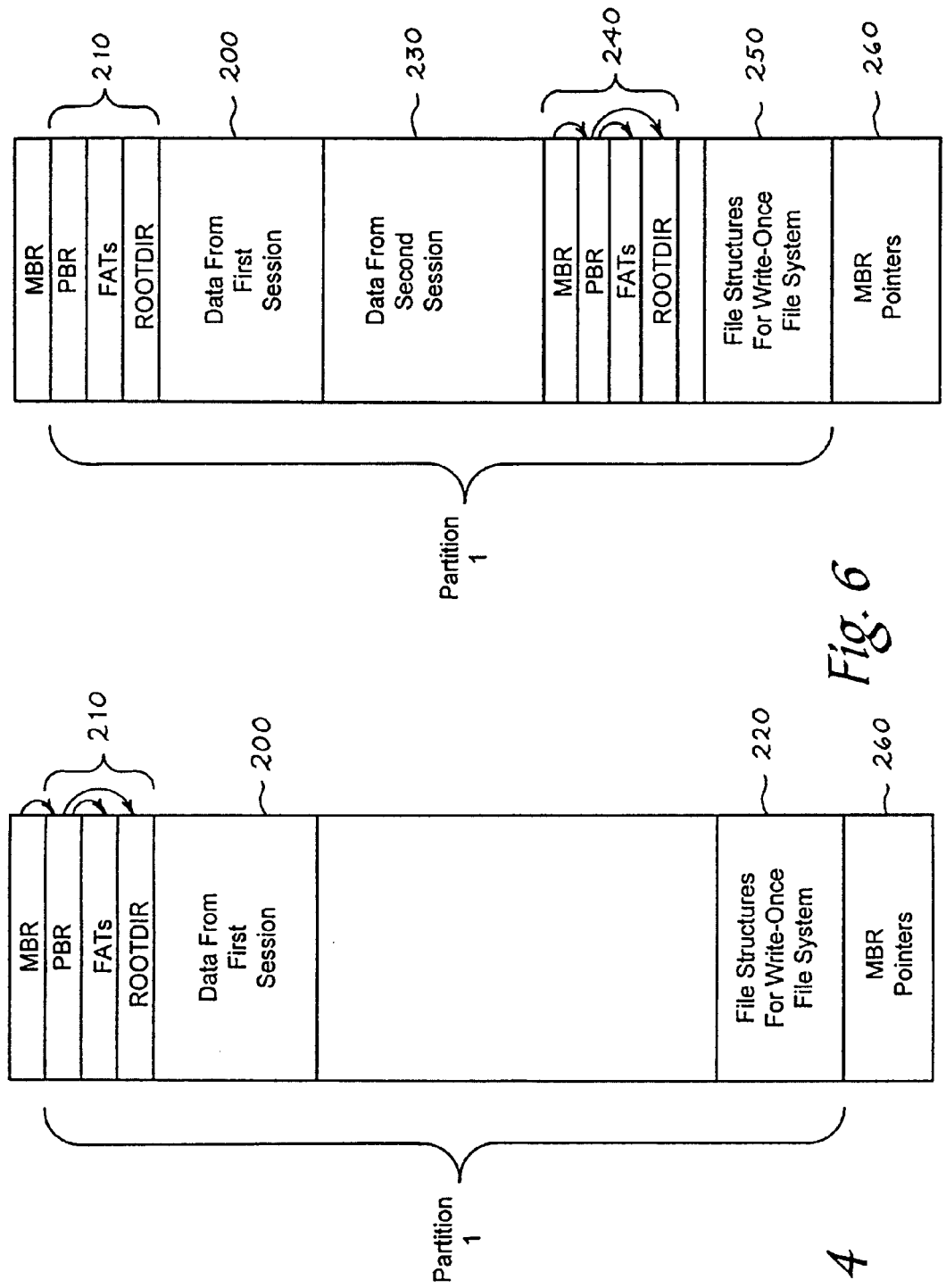

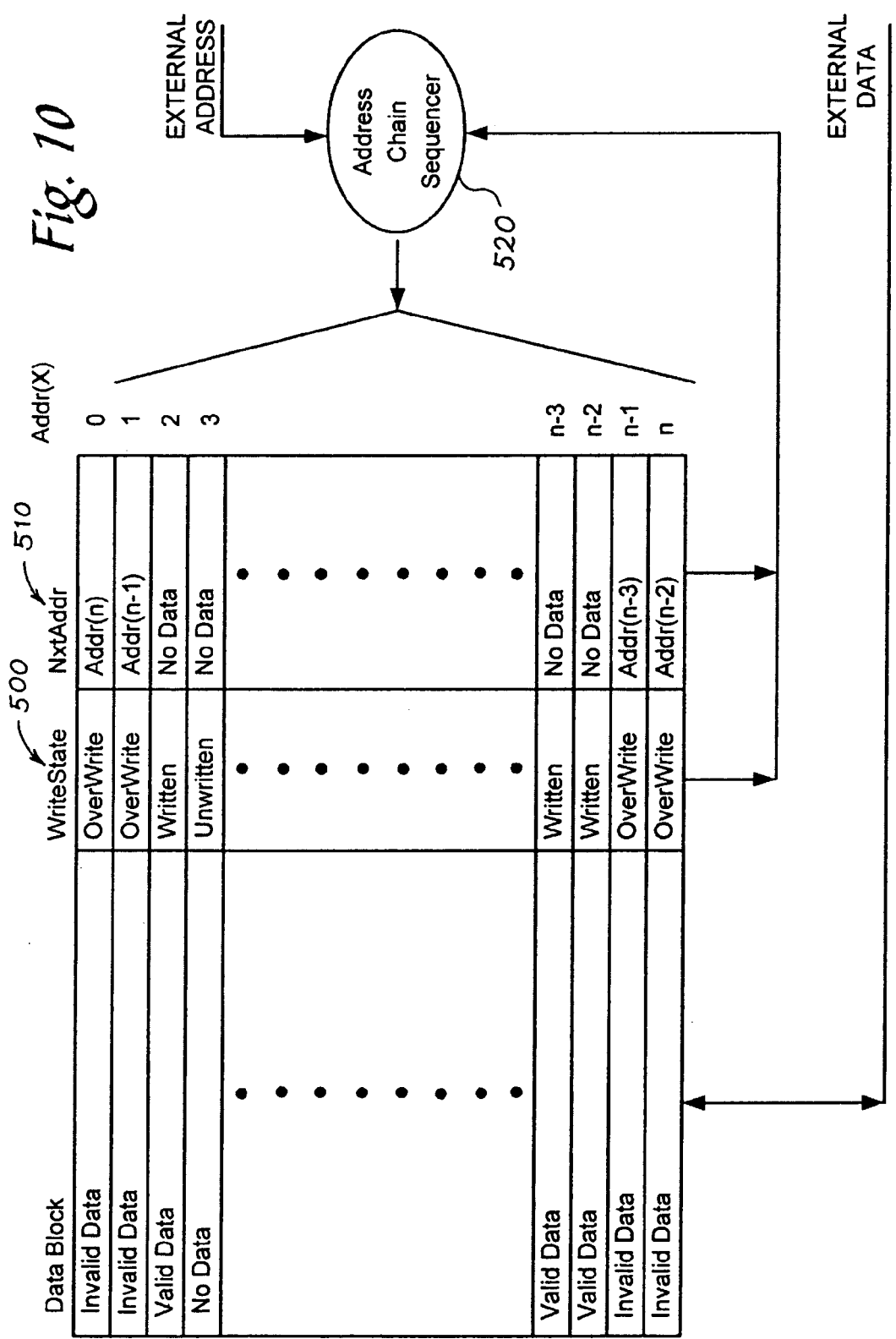

Fig. 11

| | | | |
|---|---|---|---|
| MBR From First Session | Written | No Data | 0 |
| ⋮ | ⋮ | ⋮ | |
| No Data | UnWritten | No Data | 98 |
| No Data | UnWritten | No Data | 99 |
| No Data | UnWritten | No Data | 100 |

Fig. 12

| | | | |
|---|---|---|---|
| MBR From First Session | Over Written | 100 | 0 |
| ⋮ | ⋮ | ⋮ | |
| No Data | UnWritten | No Data | 98 |
| No Data | UnWritten | No Data | 99 |
| MBR From Second Session | Written | No Data | 100 |

Fig. 13

| | | | |
|---|---|---|---|
| MBR From First Session | Over Written | 100 | 0 |
| ⋮ | ⋮ | ⋮ | |
| No Data | UnWritten | No Data | 98 |
| MBR From Third Session | Written | No Data | 99 |
| MBR From Second Session | Over Written | 99 | 100 |

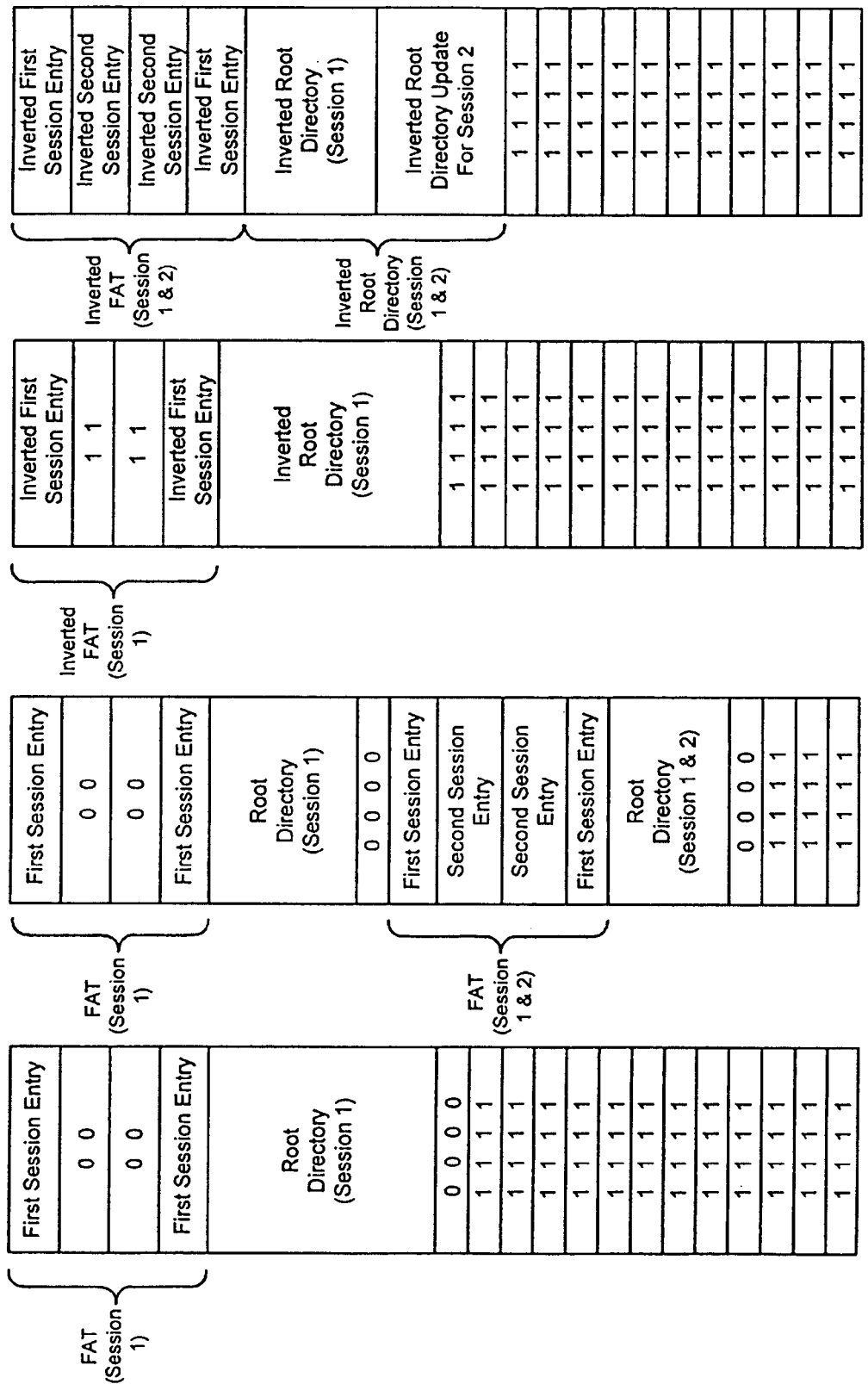

MEMORY DEVICE AND METHOD FOR STORING AND READING A FILE SYSTEM STRUCTURE IN A WRITE-ONCE MEMORY ARRAY

RELATED APPLICATIONS

This application claims the benefit of U.S. Provisional Application No. 60/282,723, filed Apr. 9, 2001, and U.S. Provisional Application No. 60/282,790, filed Apr. 9, 2001, both of which are hereby incorporated by reference.

BACKGROUND

Non-volatile memory is becoming standard in consumer appliances such as digital cameras, digital audio players, and personal digital assistants. The demands for affordable non-volatile storage media coupled with the low cost per bit of information achievable in creating write-once storage elements have given rise to the proliferation of write-once memory devices in the consumer marketplace. Write-many file systems are typically not used to store data in write-once memory devices because these file systems are designed to re-write bookkeeping data structures stored in a given set of memory cells whenever data is added or deleted. Instead, specially-designed write-once file systems, such as ISO9660 and Universal Disk Format (UDF), are used. Unfortunately, data stored using a write-once file system typically cannot be read by a write-many file system. This interoperability problem can affect a large number of users since the prevalence of the MS-DOS FAT file system (ANSI/ISO/IEC 9293-1994) in the personal computer space has lead to the broad acceptance of this write-many file system in the nascent consumer appliance market as well.

SUMMARY

The present invention is defined by the following claims, and nothing in this section should be taken as a limitation on those claims.

By way of introduction, the preferred embodiments described below provide a memory device and method for storing and reading a file system structure in a write-once memory array. In one preferred embodiment, a plurality of bits representing a file system structure is inverted and stored in a write-once memory array. When the inverted plurality of bits is read from the memory array, the bits are inverted to provide the file system structure bits in their original, non-inverted configuration. With this preferred embodiment, a file system structure can be updated to reflect data stored in the memory array after the file system structure was written. Other preferred embodiments are provided, and each of the preferred embodiments described herein can be used alone or in combination with one another.

The preferred embodiments will now be described with reference to the attached drawings.

BRIEF DESCRIPTION OF THE DRAWINGS

FIG. 4 is an illustration of a logical organization of a memory array after data from a first session is stored in a write-once memory device of a preferred embodiment.

FIG. 6 is an illustration of a logical organization of a memory array after data from a second session is stored in a write-once memory device of a preferred embodiment.

FIG. 7 is a first illustration of a master boot record pointer table of a preferred embodiment.

FIG. 8 is a second illustration of a master boot record pointer table of a preferred embodiment.

FIG. 9 is a third illustration of a master boot record pointer table of a preferred embodiment.

FIG. 10 is an illustration of a memory array of a preferred embodiment storing a write state and an address of an alternate data location.

FIG. 11 is an illustration of a memory array of a preferred embodiment storing a write state and an address of an alternate data location where a master boot record from a first session is stored.

FIG. 12 is an illustration of the memory array of FIG. 111 after a master boot record from a second session is stored in the memory array.

FIG. 13 is an illustration of the memory array of FIG. 111 after a master boot record from a third session is stored in the memory array.

FIGS. 19A and 19B are illustrations of a memory array of a preferred embodiment storing file system structures.

FIGS. 20A and 20B are illustrations of a memory array of a preferred embodiment storing inverted file system structures.

DETAILED DESCRIPTION OF THE PRESENTLY PREFERRED EMBODIMENTS

Figure 1:
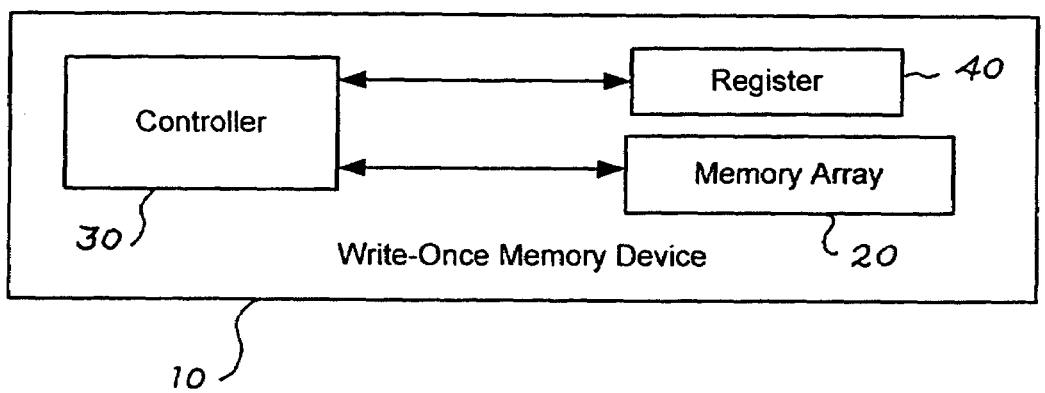
FIG. 1 is an illustration of a write-once memory device of a preferred embodiment.

Turning now to the drawings, FIG. 1 is an illustration of a write-once memory device 10 of a preferred embodiment. As shown in FIG. 1, the write-once memory device 10 includes a memory array 20 comprising a plurality of write-once field-programmable memory cells. The write-once memory device 10 also includes a memory array controller 30 that controls read and write operations to and from the memory array 20. The controller 30 can be entirely or partly formed as an array of CMOS gates on the same substrate that supports the memory array 20. The write-once memory device 10 also includes a register 40, which can be separate from the controller 30 (as shown in FIG. 1) or integrated with the controller 30.

A field-programmable memory cell is a memory cell that is fabricated in an initial, un-programmed digital state and can be switched to an alternative, programmed digital state at a time after fabrication of the memory cell. For example, the original, un-programmed digital state can be identified as the Logic 0 state, and the programmed digital state can be identified as the Logic 1 state. Because the memory cells are write-once, an original, un-programmed digital state of a memory cell (e.g., the Logic 0 state) cannot be restored once switched to a programmed digital state (e.g., the Logic 1 state). While a conventional two-dimensional memory array can be used, it is preferred that the memory array 20 be a three-dimensional memory array, such as those described in the following patent documents, each of which is hereby incorporated by reference: U.S. Pat. Nos. 6,034,882 and 5,835,396 and U.S. patent application Ser. Nos. 09/638,428; 09/638,334; 09/727,229; 09/638,439; 09/638,427; 09/638,334; 09/560,626; and 09/662,953. As discussed in those documents, three-dimensional memory arrays provide important economies in terms of reduced size and associated reductions in manufacturing cost. While this write-once memory device 10 takes the form of a solid-state memory device (i.e., a memory device that responds to electrical read and write signals to cause digital information to be read from and stored in a memory array of the device), other types of memory devices can be used, such as optical memory devices (e.g., CD ROMs). Accordingly, the claims should not be read as requiring a specific type of write-once memory device (e.g., solid-state or optical) or specific type of memory array (e.g., two dimensional or three-dimensional) unless explicitly recited therein.

Figure 2:
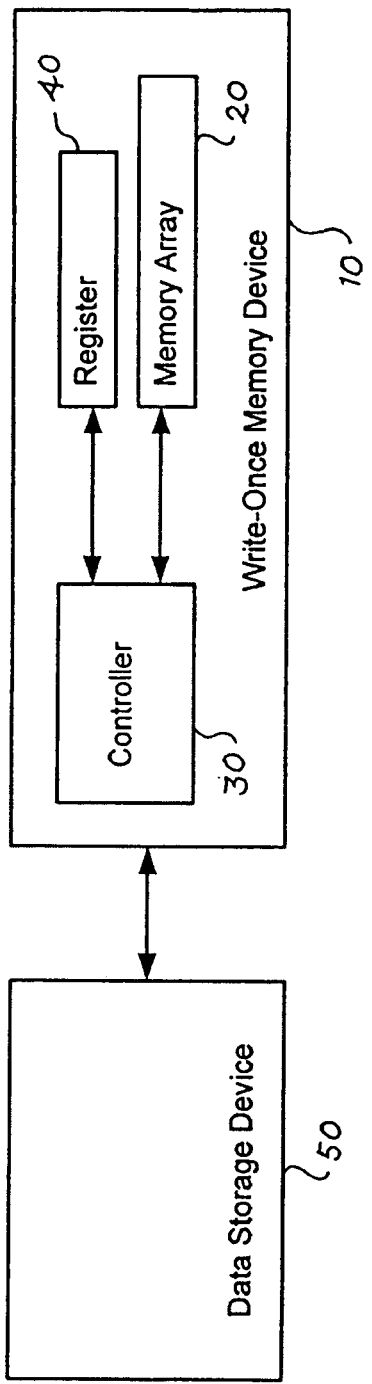
FIG. 2 is an illustration of a write-once memory device of a preferred embodiment releasably coupled with a data storage device.

In this preferred embodiment, the memory device 10 takes the form of a compact, handheld unit, such as a memory card or stick. The memory device 10 further comprises an external electrical connector (not shown) and is modular in the sense that it can be easily connected to and disconnected from a device having a mating electrical connector. For example, as shown in FIG. 2, the memory device 10 can be connected to a data storage device 50. As used herein, the terms "connected to" and "coupled with" are intended broadly to cover elements that are connected to or coupled with one another either directly or indirectly through one or more intervening components. Also as used herein, the term "data storage device" (or "authoring device") is intended to broadly refer to any device that can field-program digital data into the memory array 20 of the memory device 10. The data storage device can itself contain or create the digital data or can retrieve the digital data from another location. Examples of data storage devices include, but are not limited to, consumer devices such as a digital audio player, a digital audio book, an electronic book, a digital camera, a game player, a general-purpose computer, a personal digital assistant, a portable telephone, a printer, and a projector. "Digital data" can take any form, such as digital music, digital audio (e.g., voice/speech), digital video, at least one digital still image, a sequence of digital images, digital books, digital text (e.g., news or driving directions), a digital map, games, software, or any combination thereof. It should be noted that a data storage device can also read digital data stored on the write-once memory device 10. For example, a digital camera can both store digital images acquired by the camera and read digital images stored in the write-once memory device 10 for display on the camera's liquid crystal display.

After the data storage device stores digital data in the write-once memory device 10, the memory device 10 can be disconnected from the data storage device 50 and connected to a data reading device 60. The term "data reading device" (or "reading device") is intended to broadly refer to any device that can read digital data stored in the memory array 20 of the memory device 10. Examples of data reading devices include, but are not limited to, consumer devices such as a digital audio player, a digital audio book, an electronic book, a digital camera, a game player, a general-purpose computer, a personal digital assistant, a portable telephone, a printer, and a projector. In addition to reading data, a data reading device can also write data in the memory device 10.

As described in the background section above, because write-many file systems require a memory device to be re-writeable, write-once file systems have been developed to store data in a write-once memory device. In most applications, the write-once file system must be used to both write data to and read data from the memory device. The assignee of the present application has presented an alternative to this all-or-nothing approach in U.S. patent application Ser. No. 09/748,589, which is hereby incorporated by reference. With this solution, even though a write-once file system is used to write data to the memory device, a write-many file system, such as the ubiquitous DOS FAT file system, can be used to read data from the memory device. This allows a write-once memory device, which is not FAT compatible for write operations, to be FAT compatible for read operations.

As described in U.S. patent application Ser. No. 09/748,589, memory cells are reserved in the appropriate locations in the memory device for file system structures of a write-many file system. After data is stored in the write-once memory device using a write-once file system, file system structures for both the write-once file system and a write-many file system are stored so that the stored data can be read by any data reading device using the write-many file system or the write-once file system. The writing of file system structures is sometimes referred to as "closing" the memory device. Because the reserved memory cells can only be written into once, write-many file system structures cannot be updated when data is added to the memory device. Since data stored after the memory device has been "closed" will not be reflected in the previously-written file system structures, the newly-stored data will not be readable by a data reading device using a write-many file system. Accordingly, file system structures are preferably stored when the memory device is filled or when a user indicates that no more data is to be stored in the memory device. This approach is perfectly suitable for many applications. For example, a user accustomed to using a conventional film-based camera may prefer to "close" a write-once memory device only after the memory device has been filled with pictures. However, in some applications, a user may wish to store data on the write-once memory device over multiple sessions. The following preferred embodiments find use in those applications.

By way of overview, the preferred embodiments described below allow a memory device to be "closed" multiple times (e.g., after each session), thereby allowing a write-many file system to read data stored after the memory device was first "closed." In this way, data stored in the memory device over multiple session using a write-once file system can be read by a write-many file system. As used herein, a "session" includes the time period when data is stored in the memory device and ends when file system structures associated with that data are stored in the memory device. Thus, a new session takes place when data is stored in the memory device after file system structures from a previous session have been written in the memory device. A session can end in response to a user action (e.g., when a user ejects the memory device 10 from a data storage device 50) or can end when the memory device is completely or nearly completely filled with data. While a memory device can be removed from a data storage device between sessions, multiple sessions can take place without removing the memory device from the data storage device. This can occur, for example, when a user presses a button on a digital camera to indicate that he has ended a session and then decides to take additional pictures before removing the memory device.

This preferred embodiment will be now be illustrated with reference to the DOS FAT file system. This preferred embodiment allows a write-once memory device to be "closed" multiple times, thereby allowing data stored over multiple sessions to be read by a DOS FAT file system. In this way, the write-once memory device is both updateable and DOS FAT read compatible. During formatting of the memory device 10, one or more partitions are created, and a master boot record (MBR) is written at address zero, per DOS FAT protocol. The MBR points to the location of partition boot records (PBRs) of the memory device. A PBR is found at the start of each partition of the memory device and contains information that can be used to locate the partition's file allocation table (FAT) and root directory. A FAT is a table structure that stores a chain of blocks in use by a file. The end of the chain of blocks is indicated with an end-of-file marker. A FAT also stores information on which blocks are free and which blocks are bad. Two copies of the FAT are typically stored in a partition. A root directory links descriptive information about a file (e.g., its name, size, attributes, etc.) with information stored in the FAT about its physical location in the memory device. Preferably, the memory locations where the DOS FAT file system expects to find file system structures are reserved locations to prevent user data from being stored therein. Since the PBR, FATs, and root directory can be derived from the MBR, a write-many file system only needs to know the location of the MBR to determine the location of the other file system structures, as described below.

Figure 3:
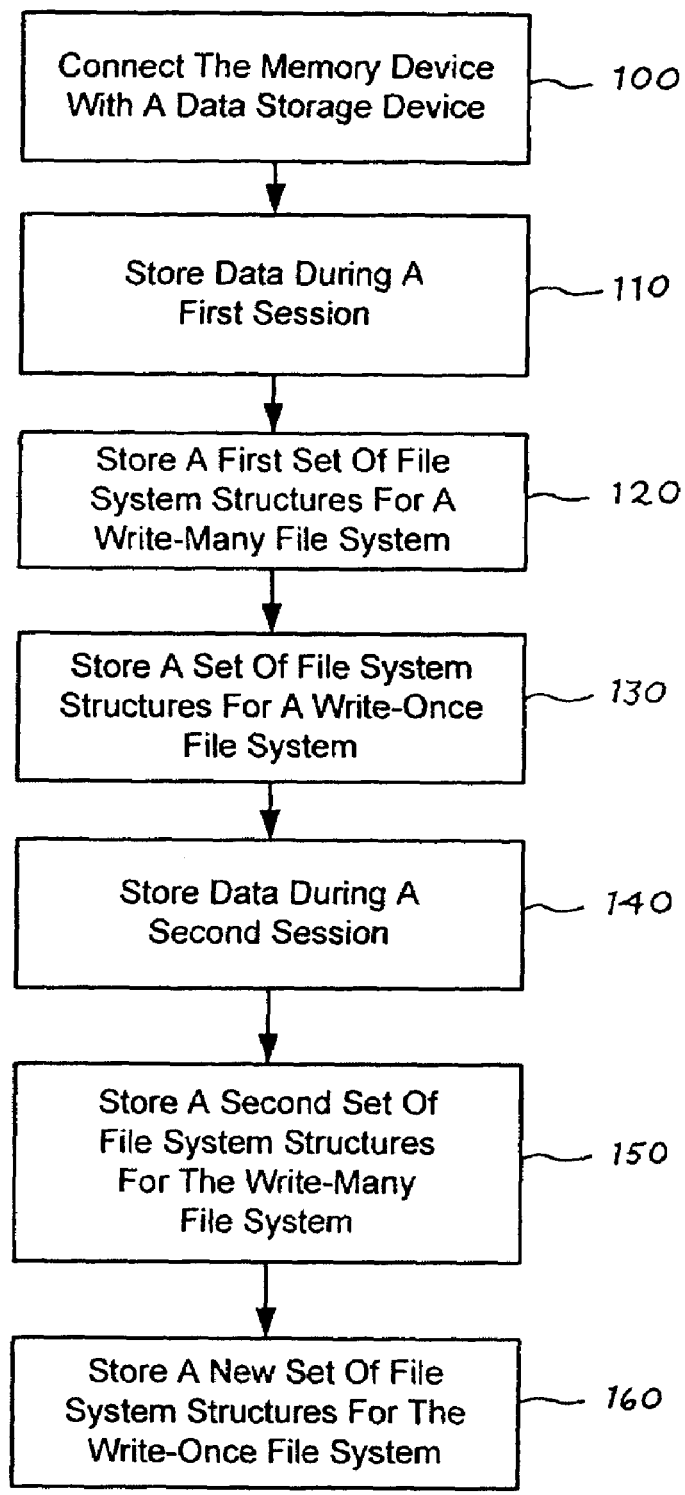
FIG. 3 is a flow chart of a method of a preferred embodiment for reading data in a write-once memory device using a write-many file system.

Turning again to the drawings, FIG. 3 is a flow chart of a method of a preferred embodiment for reading data in the write-once memory device 10 using a write-many file system. This method will be described in conjunction with the illustrations of the memory array 20 in FIGS. 4 and 6. The memory array 20 in FIGS. 4 and 6 has only a single partition to simplify this example. It should be noted that more than one partition can be used. FIGS. 4 and 6 also diagrammatically show the interrelation between the MBR, PBR, FATs, and root directory. Returning to the flow chart, the memory device 10 is first connected with a data storage device 50 (act 100). Next, data 200 is stored in the write-once memory device 10 during a first session (act 110). In operation, the digital storage device 50 sends data to the controller 30 of the memory device 10, which stores the data in the memory array 20. At the conclusion of the first session, a first set of file system structures 210 for the write-many file system is stored in the memory array 20 (act 120) (i.e., the memory device 10 is "closed" for the first time). As used herein, a "set" can include one or more than one element. Here, the PBR, FATs and the root directory are written into the memory cells reserved for these file system structures. If the master boot record (MBR) is not stored during formatting of the memory device 10, it can be stored with the other file system structures. (As described in more detail below, the data storage device 50 also stores a pointer to the location of the MBR. Since the current version of the MBR is located at address 0 here, a pointer does not need to be stored. If the MBR were initially stored at another location, the technique described below could be used to locate the MBR.) A set of file system structures 220 for the write-once file system is also stored (act 130) to allow the data 200 to be read by a data reading device using the write-once file system.

Figure 5:
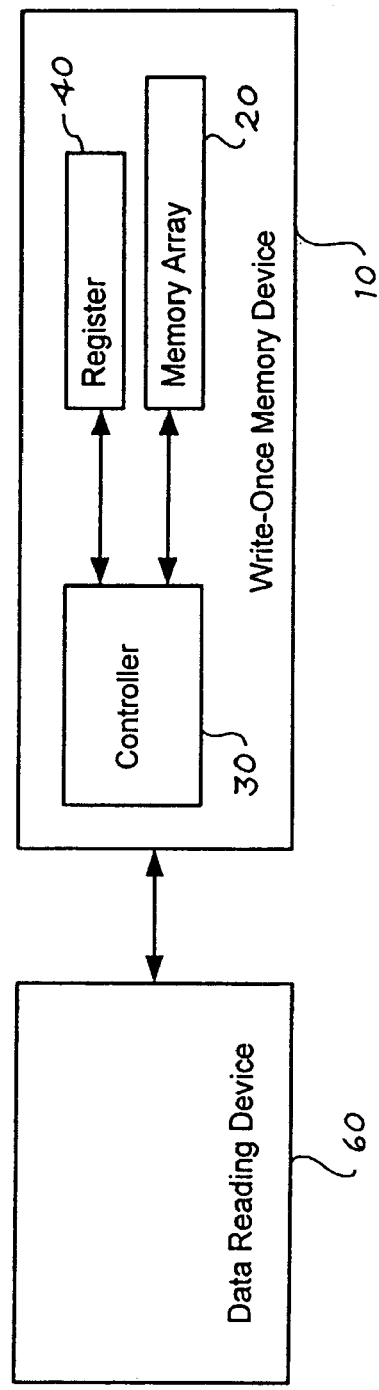
FIG. 5 is an illustration of a write-once memory device of a preferred embodiment releasably coupled with a data reading device.

With the first set of file system structures 210 stored, the memory device 10 can be removed from the data storage device 50 and inserted into a data reading device 60 using the DOS FAT file system (see FIG. 5). The data reading device 60 sends a read address zero command to the memory device 10 per DOS FAT protocol, and the controller 30 returns the MBR stored in address 0. (As described in more detail below, the controller 30 does not always return the MBR stored in address 0 in response to a command to read address 0. However, at this time, the current version of the MBR is stored at address 0.) Because the location of the PBR can be derived from the MBR and the locations of the FATs and the root directory can be derived from the PBR, the write-many file system of the data reading device 60 can read any of the data stored in the memory device 10 during the first session even though a write-once file system was used to store the data.

With reference to FIG. 6, the memory device 10 is later re-inserted into the data storage device 50 (or inserted into a different data storage device), and data 230 from this second session is stored in the memory device (act 140). At the conclusion of the second session, a second set of file system structures 240 for the DOS FAT file system is stored in the memory array 20 (act 150). As shown in FIG. 6, the second set of file system structures 240 includes a new MBR, PBR, FATs and root directory, which include information on the data stored during both the first and second sessions. Because the memory array 20 comprises write-once memory cells, the first set of file system structures 210 cannot be updated to reflect the data stored during the second session. Accordingly, the second set of file system structures 240 is stored in an available location in the memory array. In one embodiment, the controller 30 of the memory device 10 redirects the second set of file system structures 240 to an available location in the memory array 20 to avoid overwriting the first set of file system structures 210. A new set of file system structures 220 for the write-once file system is also stored at the conclusion of the second session (act 160).

Because a DOS FAT file system always looks for file system structures at the same location of the memory array 20 (the locations occupied by the first set of file system structures 210), the DOS FAT file system will not read the second set of file system structures 240. Accordingly, the DOS FAT file system will not be able to read the data stored during the second session 230. However, if data traffic between the memory device 10 and the data reading device 60 were redirected such that second set of file 1 system structures 240 (instead of the first set of file system structures 210) were provided to the data reading device 60, the data reading device 60 would have access to data stored during both the first and second sessions. To achieve this result, a pointer to the memory location storing the up-todate MBR can be stored in the memory device 10. When a write-many file system attempts to read a memory location containing an out-of-date file system structure, the current file system structure stored at the memory location indicated by the pointer will be returned.

Since a new pointer would be written every time the bookkeeping data is updated (i.e., with each "close" of the memory device 10), it is preferred that a portion 260 of the memory array 20 be reserved for pointers to avoid the possibility of running out of memory space to store the pointers. Preferably, this portion is outside of the partition so that user data cannot be written into the MBR pointer portion 260 and so that pointers cannot be "obliterated" by the user. Alternatively, the portion 260 can be stored as a reserved or read-only file within the partition that can be written into only when the controller 30 is in a special mode. Of course, other alternatives are possible. It is also preferred that a pointer be written after (not before) data is stored in the memory array 20. In this way, if a power loss occurs during a write operation, the last-stored pointer would point to the previously-written MBR instead of an empty (or partially written) set of memory cells.

FIGS. 7–9 are illustrations of the memory cells of the MBR pointer portion 260. In these figures, a line of four bits is shown to simplify the drawings, and each line of written memory cells corresponds to a pointer. FIG. 7 shows the initial state of the memory cells in the MBR pointer portion 260. As discussed above, in this embodiment, the MBR written to the memory array 10 during formatting is accurate for the data stored during the first session. Accordingly, a pointer is not written into the MBR pointer portion 260 of the memory array 20 at the conclusion of the first session. If a new MBR is stored at address 0101 at the end of the second session, a corresponding pointer is stored in the MBR pointer portion 260, as shown in FIG. 8. Similarly, if a new MBR is stored at address 1101 at the end of a third session, a pointer to that address is stored in the MBR pointer portion 260 following the previously-stored pointer, as shown in FIG. 9.

When the memory device 10 is connected to a data reading device 60, the memory device 10 is powered-up, and circuitry in the controller 30 queries the MBR pointer portion 260 to find the last valid entry. (This can also occur in response to a commanded device reset operation.) To find the current pointer, the controller 30 preferably identifies the last line of written data by locating the first line of unwritten memory cells. For example, the controller 30 can perform the following sequence:

```
if (*overwrite_buf !=UNPROGRAMMED) {
    while (*overwrite_buf !=UNPROGRAMMED) {
        *MBR=*overwrite_buf++;
    }
}
```

This and other temporal-to-spatial mapping techniques are described in U.S. patent application Ser. No. 09/748,589.

The controller 30 then stores the current pointer in the memory device's register 40 (e.g., the memory device's RAM). This stored address will be used when any device sends a request to read address zero—the standard location of the MBR in the DOS FAT file system. In this way, all subsequent requests for the MBR are redirected to the location indicated by the pointer. For example, when the data reading device 60 sends a read address zero command to the memory device 10, the controller 30 returns the new MBR located at the address stored in register 40 instead of the out-of-date MBR stored at address zero. Accordingly, the most up-to-date version of the MBR is sent to the data reading device 60 even though it was not stored at the address expected by the data reading device's DOS FAT file system (logic address zero). As discussed above, the location of the current PBR is derived from the MBR and the locations of the current FATs and root directory are derived from the current PBR. Accordingly, the data reading device 60 can read the data stored during both the first and second sessions.

It should be noted that the functionality described above can be distributed among the data storage device 50, the memory device 10, and the data reading device 60 in any desired manner. In one preferred embodiment, the functionality resides solely in the memory device 10. For example, the controller 30 of the memory device 10 can direct the storage of an MBR to an available location in the memory array 20 and store a pointer to the MBR after it is written. The controller 30 can also retrieve the pointer during power-up of the memory device 10 and be responsible for returning the MBR stored in the memory location indicated by the pointer in response to a read address zero command from the data reading device 60. With this implementation, any special knowledge of write-many emulation would be limited to the write-once memory device 10 itself, and no hardware or software adjustments would be needed in either the data storage device 50 or the data reading device 60. To lower the cost and complexity of the memory device 10, some of the emulation tasks can be distributed between the memory device 10 and the hardware and/or software of the data storage device 50. For example, the data storage device 50 (instead of the controller 30) can be responsible for storing the MBR in an available location in the memory array 20 and storing a pointer to the MBR in the reserved portion 260. A file system copy-and-invalidate resource of the data storage device 50 can also keep track of over-write bookkeeping. With either of these implementations, no modification is needed to the data reading device 60, thereby providing a high degree of interoperability with all existing playback devices. In addition, the process of redirecting the request for the MBR is completely hidden from the data reading device 60. However, if desired, some of the emulation tasks can be distributed to the data reading device 60 as well. For example, hardware and/or software of the data reading device 60 (instead of the controller 30 of the memory device 10) can be responsible for retrieving the stored pointer and sending a read request designating the address indicated by the stored pointer instead of address zero.

In another preferred embodiment for achieving rewrite emulation using a write-once storage medium, redirection of overwritten data is determined at the level of the smallest grouping of data allowed by the memory device's buffer allocation scheme. Typically, this is referred to as a sector of data based on the nomenclature used in conventional disk-based systems. In this embodiment, the memory array of the write-once storage device is constructed in such a fashion to allow two extra fields of information to be stored in association with an amount of stored user data. As shown in the memory array of FIG. 10, the two extra fields indicate a write state 500 and an address of an alternate data location 510. When a write buffer passes data to the write-once memory device, an address chain sequencer 520, which can be implemented in the memory device, queries the associated write state field 500. The write state field can include one of the states set forth in Table 1 below.

TABLE 1

WriteState Enumeration

| State | Description |
|---|---|
| UnWritten | Indicates that this section of the device is able to accept data. |
| Written | Indicates that this section of the device is holding valid written data. |
| OverWritten | Indicates that this section of the device has been overwritten and that the new valid data lies at the address indicated by the NxtAddr field. |

Table 1: WriteState Enumeration

The initial state of the WriteState sideband fields is UnWritten. When a block of data is sent to a sector address in the UnWritten state, the data is allowed to be stored at that address, and the WriteState sideband field is transitioned to the Written state. The next write to the same sector address (now in a Written state) will cause that sector to become invalidated and the new data to be redirected to a sector in the UnWritten state. The transition from Written to OverWritten involves several related actions. The controller 30 finds the next sector marked UnWritten and deposits the sector data at that location. The WriteState sideband field of the alternate location is then updated to Written. In addition, the address of this alternate location is placed in the NxtAddr sideband field of the detected overwrite, and its WriteState sideband field is simultaneously be updated to OverWritten. In this manor, multiple overwrites of a given address will form a chain of addresses terminating in the last data update received. In order to mitigate the issues resulting in software updates to addresses already taken by the controller 30 for re-direction, all candidates for over-write sectors are preferably kept in an area of memory inaccessible to the external device supplying data. As with the other preferred embodiments described above, the functionality described with respect to this preferred embodiment can be distributed among the data storage device 50, the memory device 10, and the data reading device 60 in any desired manner.

FIGS. 11–13 will be used to illustrate the operation of this preferred embodiment when a DOS FAT file system is used. In FIG. 11, an MBR from a first session is written at address 0, per DOS FAT protocol. Because valid data is written into this sector, the WriteState field is "Written," and the NxtAddr field contains no data. When an MBR from a second session is to be stored in the memory array, the controller 30 prevents this new MBR from overwriting the data in address zero and stores the MBR in an available location in the memory array. As shown in FIG. 12, the MBR from the second session is stored at address 100. The controller 30 also changes the WriteState field of address zero to "OverWritten" and writes address 100 into the NxtAddr field. When the memory device is read by a data reading device, a read address zero command will be sent to the controller 30. In response to this command, the controller 30 examines address zero and finds that the data stored therein is designated as overwritten and that current, valid data is stored at address 100. The controller 30 then returns the MBR from the second session stored at address 100 to the data reading device instead of the out-of-date MBR from the first session stored at address 0. As shown in FIG. 13, when a MBR from a third session is to be stored in the memory array, the controller 30 stores the new MBR in an available location in the memory array (here, address 99). The controller 30 also changes the WriteState field of address 100 to "OverWritten" and writes address 99 into the NxtAddr field. In response to a read address zero command from a data reading device, the controller 30 examines address zero and finds that the data stored therein is designated as overwritten and that current, valid data is stored at address 100. When the controller examines address 100, it finds that the data stored therein is also designated as overwritten and is directed to address 99. As shown by this example, the controller "walks the chain" from address 0 to address 100 to address 99 to find the current valid MBR.

In the above examples, the data reading device 60 sent a read address zero command to the memory device 10 to read the MBR. This command was translated either by the memory device 10 or by hardware and/or software in the reading device 60 so that the current MBR, which was not stored at address zero, was returned to the data reading device 60. The data reading device 60 then derived the location of the current PBR from the current MBR and, from the current PBR, derived the locations of the current FATs and the current root directory. However, some data reading devices send a request to read the address where they expect to find the PBR (not the MBR) so that resources are not spent deriving the PBR from the MBR (thereby increasing performance). The preferred embodiments described above can be modified so that the pointer indicates the location of the current PBR instead of the location of the MBR. As discussed above, the location of the current FATs and the current root directory can be derived from the current PBR stored in the location indicated by the pointer.

Figure 14:
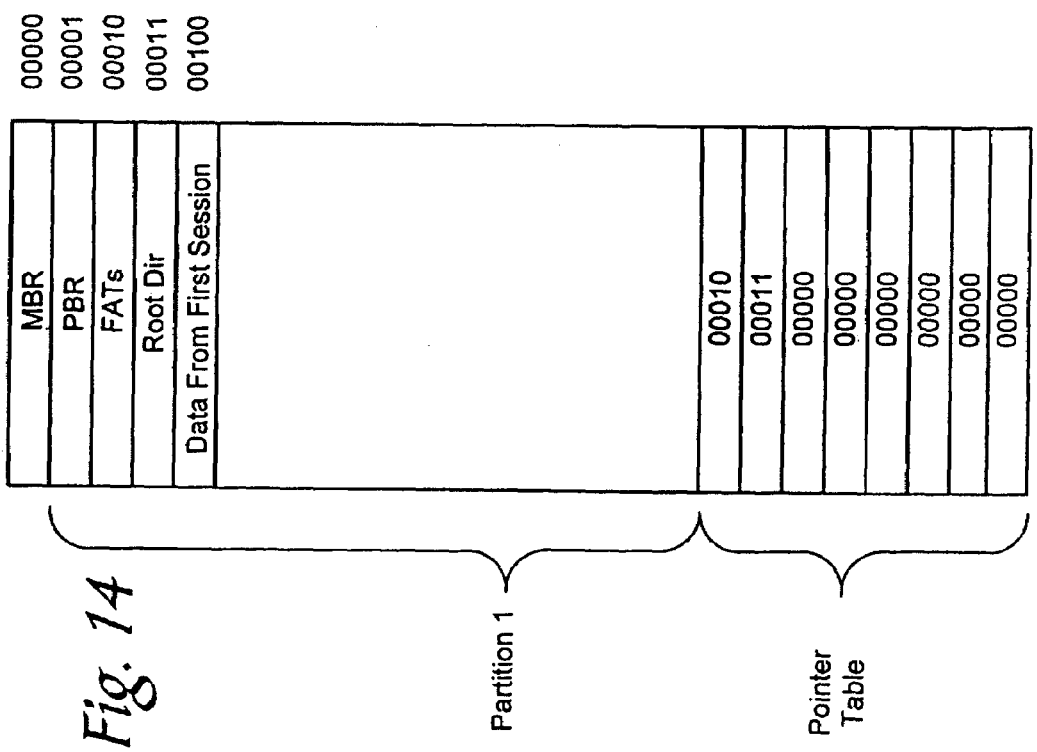

In the embodiments described above, a new PBR, new FATs and a new root directory were written to the memory device 10 when data was added or obliterated. (The "obliterate" function, which makes previously-stored data difficult or impossible to read by overwriting at least a portion of the stored data with a destructive pattern, is described in U.S. patent application Ser. No. 09/638,439, which is assigned to the assignee of the present invention and is hereby incorporated by reference.) In another preferred embodiment, both the MBR and the PBR remain static, and only new FATs and a new root directory are written. In this embodiment, pointers to the current FATs and root directory are stored instead of a pointer to the MBR (or to the PBR). This alternative will be discussed in conjunction with the illustrations of the memory array 20 in FIGS. 14 and 15. It should be noted that the addresses in this example and in the other examples provided herein are used for simplicity and are not meant to imply an actual address used by a DOS FAT file system. In FIG. 14, data from a first session is stored at address 00100, and the FATs and the root directory associated with this data are stored at addresses 00010 and 00011, respectively. Hardware and/or software in the data storage device 50 (and/or the controller 30 in the memory device 10) stores pointers to the FATs and the root directory in a pointer table outside of the partition. As shown in FIG. 14, these pointers are stored in the first two lines of the table.

Figure 15:
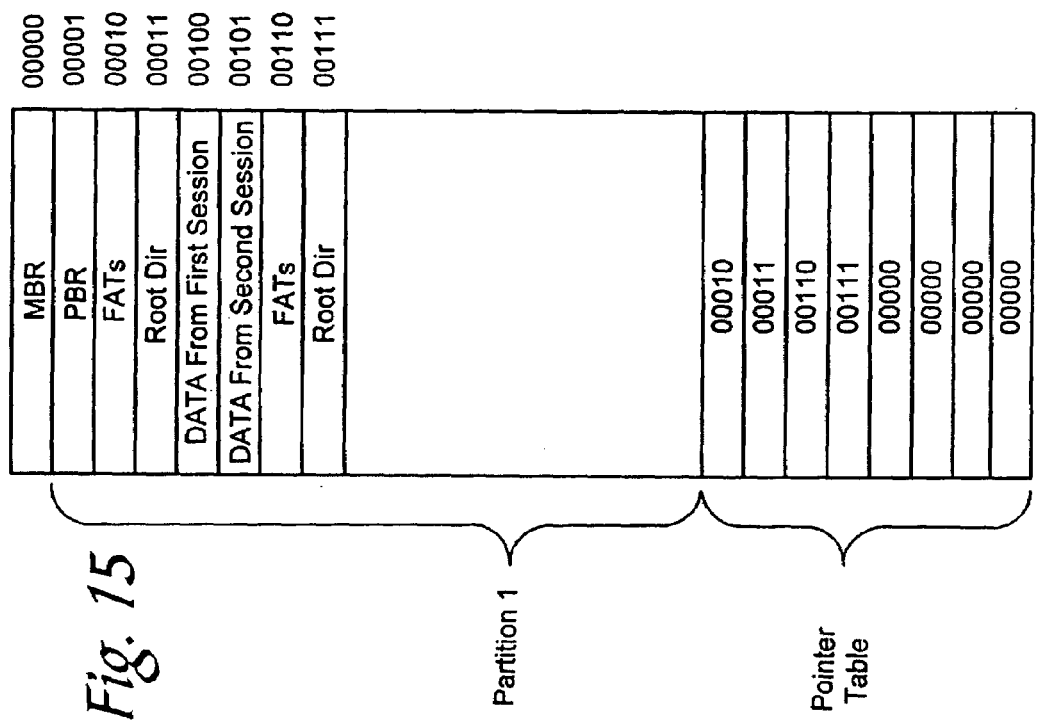
FIGS. 14 and 15 are illustrations of a memory array of a preferred embodiment where pointers to FATs and a root directory are stored.

Turning now to FIG. 15, data from a second session is stored at address 00101. In this example, the MBR and the PBR stored at 00000 and 00001 are written when the memory device 10 is formatted, and new MBRs and PBRs are not stored in the memory device 10 after data from the second session is stored. Instead, only new FATs and a new root directory are stored. Pointers to address 00110 and 00111 (the locations of the new FATs and the new root directory) are stored in the next two available lines in the pointer table following the previously-written pointers. If the root directory immediately follows the FATs (or vice versa) and the size of the FATs and root directory is known (e.g., from the PBR), a single pointer can be stored instead of two pointers.

When the memory device 10 is powered-up, the controller 30 uses the temporal-to-spatial mapping technique described above to identified the pointers to the FATs and the root directory and stores their addresses in the register 40. For example, controller 30 can locate the first line of unwritten memory cells and identify the previous line as the address of the root directory and the line before that as the address of the FATs. From the PBR, the controller 30 also identifies the addresses where the data reading device 60 would expect to find the FATs and the root directory (address 00010 and 00011). Alternatively, if the FATs and root directory are stored at predetermined addresses in the memory array 20, the controller 30 can be pre-programmed with those address. When the data reading device 60, sends a command to read address 00010 to read the FATs, the controller 30 returns the current version of the FATs stored at 00110 instead of the out-of-date FATs stored at 00010. A similar operation occurs with respect to the root directory.

Figure 17:
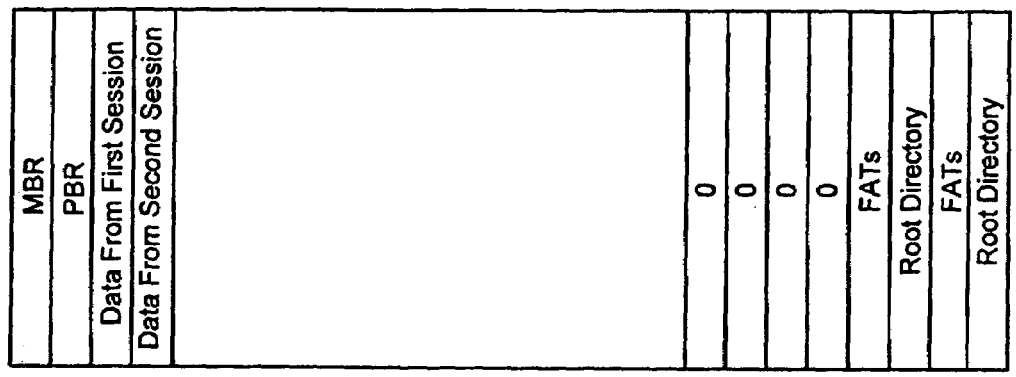
FIGS. 16 and 17 are illustrations of a memory array of a preferred embodiment where a fixed offset is used to locate stored file system structures.
Figure 16:
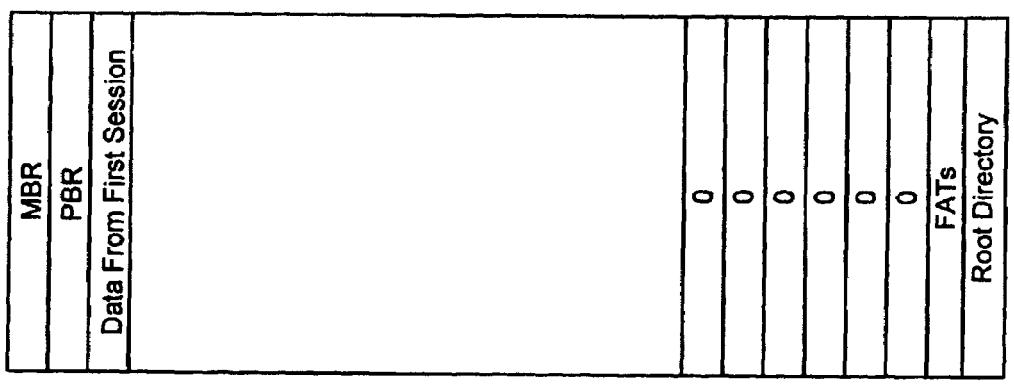

In the preferred embodiments described above, a pointer to one or more current file system structures was stored in a table or in a field associated with a set of memory cells for storing data (e.g., a sector of data). It should be noted that the pointer(s) can be stored in any other suitable location. Additionally, data can be redirected without the use of a stored pointer. The preceding example where the root directory immediately follows the FATs and the size of the FATs and root directory is known will be used to illustrate this alternative along with FIGS. 16 and 17. FIG. 16 shows data from a first session stored in a partition of the memory array 20 and the FATs and the root directory associated with this data stored in an area outside of the first partition in the memory array. In this embodiment, the FATs and the root directory are stored at the bottom of this area (the "file system structure portion"). The FATs and the root directory can also be stored in an area within the partition that is unavailable to store user data. FIG. 17 shows data from a second session stored in the partition and the FATs and the root directory associated with this data stored in the next available memory locations preceding the previously-stored FATs and root directory. When a data reading device 60 sends a command to the memory device 10 to read the addresses that it expects to find the FATs and the root directory (e.g., based on the PBR), the controller 30 locates the last line of unwritten memory cells in the area outside of the partition. Because the FATs and the root directory are of a fixed, known size, the controller reads the following X lines, where X is a fixed offset determined by the size of the FATs and the root directory. The FATs and the root directory stored in those lines are then returned to the data reading device 60.

Figure 18:
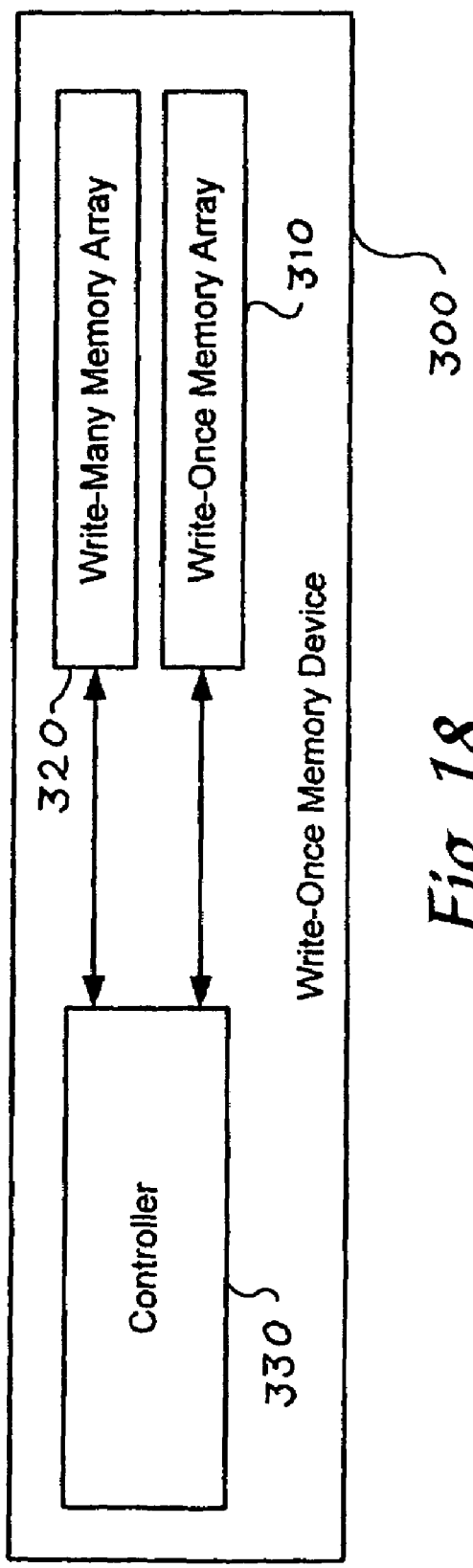
FIG. 18 is an illustration of a preferred embodiment where write-many memory is provided in a write-once memory device to store file system structures of a write-many file system.

In the preferred embodiments described above, the file system structures for the write-many file system were stored in a memory array of write-once memory cells. In another embodiment, which is shown in FIG. 18, a write-once memory device 300 is provided with both a write-once memory array 310 and a non-volatile write-many memory array 320. Although shown as a separate component, the write-many memory array 320 can be integrated with the write-once memory array 310 or with the controller 330. The write-many memory array 320 can take the form, for example, of an electrically-erasable programmable read-only memory, such as Flash memory. In operation, after data is stored in the write-once memory array 310, hardware and/or software in a data storage device (or the controller 330 in the write-once memory device 300) would stored file system structures of a write-many file system in the write-many memory array 320. Because these structures are written in re-writable memory, they can be updated when additional data is stored in the write-once memory array 310. For example, new FATs and a new root directory can be re-written over the previously-written FATs and root directory. When a data reading device sends a read command for the addresses storing these file system structures, the controller 330 reads those addresses from the write-many memory array 320 instead of the write-once memory array 310. Alternatively, hardware and/or software in the data reading device can send a command to read the addresses from the write-many memory array 320 instead of the write-once memory array 310.

For simplicity, the operation of the preferred embodiments described above was illustrated in conjunction with the DOS FAT file system. It should be noted the techniques described above for achieving rewrite emulation using a write-once memory device are not limited to the DOS FAT file system and that any other write-many file system can be used. Additionally, in the above-described preferred embodiments, the pointer only pointed to the MBR. In an alternate embodiment, a pointer to the PBR, FATs, and/or root directory can also be used in addition to or instead of the pointer to the MBR. Also, while the preferred embodiments discussed above stored file system structures for both a write-many and a write-once file system, file system structures of two different write-once file systems or two different write-many file systems can be used. Further, while the preferred embodiments were discussed in terms of two file systems, the preferred embodiments can be extended to achieve interoperability among three or more different file systems. In yet another alternate embodiment, only write-many file system structures are stored (and not write-once file system structures) even though a write-once file system is used to store data and write-many file structures.

As discussed above, because file system structures are stored in write-once memory cells, file system structures cannot be updated to reflect changes made to stored data. If stored data is modified or deleted in a subsequent session, the memory array needs to be closed with new file system structures to reflect the modification or deletion. However, if data is merely added during a subsequent session, new file system structures may not need to be written. Instead, previously-written file system structures can be appended with information concerning the newly-stored data. For example, a string of 0s usually represents unallocated entries in a FAT and also represents the end of a directory (e.g., root directory or sub-directory). If a new file is added to the memory array after the memory array is closed with file system structures, the location of the new file can be written into the 0s in the FAT, and the name and attributes of the new file can be written into the 0s at the end of the directory. In this way, information about the new file is appended to pre-existing file system structures, and memory space is conserved.

Unfortunately, write-once memory arrays having Logic 1 as their initial, un-programmed digital state may not be able to take advantage of this memory-saving technique. This limitation will be illustrated in conjunction with the memory array of FIGS. 19A and 19B. In FIG. 19A, the FAT contains two first session entries describing the location of data stored in the memory array during the first session, and two unallocated entries (00). To create the 0s in the two unallocated entries, the memory cells are permanently switched from their initial Logic 1 state to a programmed Logic 0 state. Similarly, the memory cells following the root directory are permanently switched from Logic 1 to Logic 0 to indicate the end of the root directory. Because the memory cells storing the 0s in the FAT and the root directory cannot be switched back to their original Logic 1 state, the FAT and the root directory cannot be updated when data is added to the memory array during a second session. Accordingly, the memory array needs to be closed with a new FAT and root directory to reflect the data added during the second session, as shown in FIG. 19B. (A similar problem occurs when memory cells have Logic 0 as their initial digital state, and "empty" memory cells are designated as Logic 1.)

To overcome this limitation, it is preferred that the bits representing file system structures be inverted before they are stored in the memory array. In this way, Logic 1 bits of file system structures are stored as Logic 0 bits, and Logic 0 bits of file system structures are stored as Logic 1 bits. Because Logic 1 is the initial state of the memory array, Logic 1 bits are "stored" by not switching the initial state of a memory cell to Logic 0. Accordingly, some or all of these memory cells can later be switched to the Logic 0 state to update the FAT and the root directory. FIGS. 20A and 20B illustrate how this approach can be used with the previous example. Instead of storing a FAT and a root directory, an inverted FAT and an inverted root directory are stored in the memory array. As shown in FIG. 20A, the bits representing the first session entries are inverted and stored as inverted first session entries, and the 0s representing unallocated entries are inverted and stored as 1s. Similarly, the bits representing the root directory are inverted and stored as an inverted root directory, and the string of 0s that indicates the end of the root directory is inverted and stored as 1s. Since the initial digital state of the memory cells is Logic 1, the memory cells storing the unallocated entries in the FAT and the string of 1s at the end of the root directory are left in the un-programmed state. Accordingly, some or all of these memory cells can later be programmed as 0s to update the FAT and the root directory. The bits representing these updates are also stored in an inverted form, as shown in FIG. 20B.

When the bits representing the inverted file system structures are read from the memory array, they are inverted to provide the file system structures in their original, non-inverted configuration. Accordingly, the inverted FAT is read as a FAT, and the inverted root directory is read as a root directory. Additionally, the string of 1s in the inverted FAT is read as a string of 0s (an unallocated entry), and the string of 1s in the inverted root directory is read as a string of 0s (indicating the end of the root directory).

By inverting file system structure bits, this preferred embodiment essentially redefines the value of the unwritten bit in the file system structure section of the memory array as Logic 0 and avoids the need to write new file system structures during each close operation. Instead, a previously-written file system structure can be updated or appended to reflect the addition of data after the last close operation. This "close-append" function saves about 28 KBytes of memory space per close operation (the size of two FATs and a root directory in a FAT 12, 64 megabyte memory card with a cluster size of 16 kilobytes) since the FATs and root directory are not replaced. A "close-rewrite" function is still available for those situations where file system structures need to be replaced because previously-stored data has been modified or deleted. If redirection pointers are used, a new pointer would be written for a close-rewrite function, but not necessarily for a close-append function.

Figure 21:
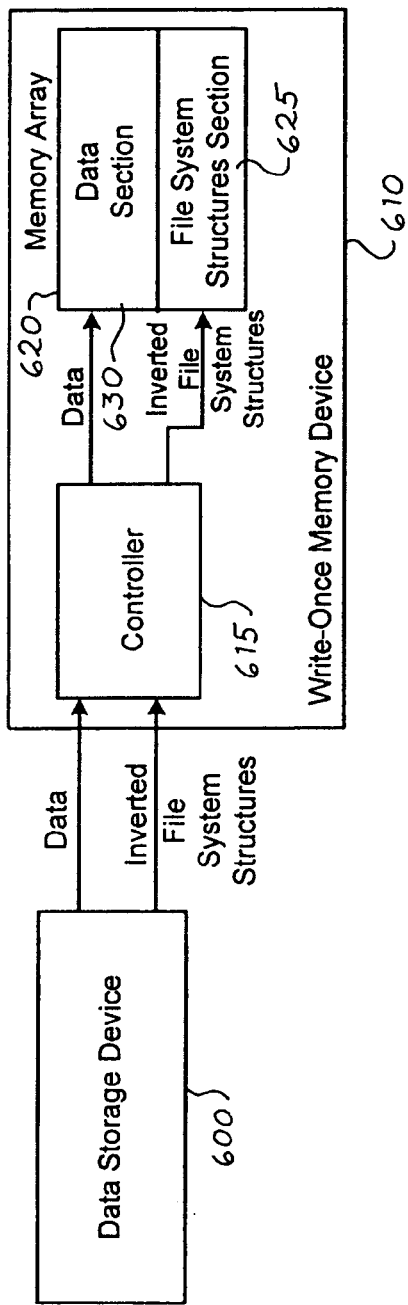
FIG. 21 is an illustration of a preferred embodiment in which a data storage device inverts file system structure bits to be stored in a memory array.
Figure 22:
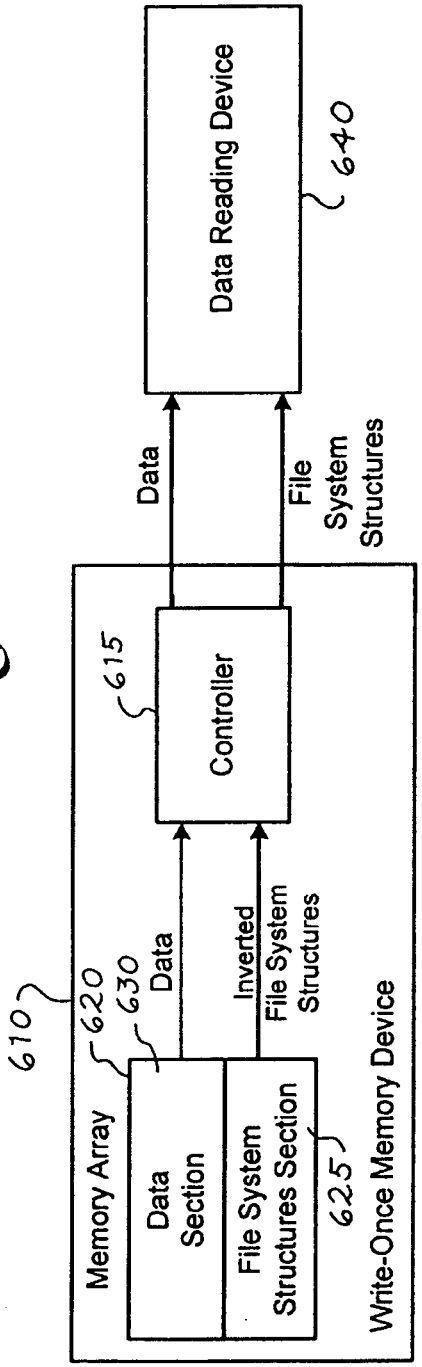
FIG. 22 is an illustration of a preferred embodiment in which a controller of a write-once memory device inverts file system structure bits read from a memory array.

Hardware and/or software in a data storage device, data reading device, and/or write-once memory device can be responsible for inverting file system structure bits to be stored in or read from a write-once memory array. FIGS. 21–25 illustrate various configurations. In FIG. 21, a data storage device 600 is coupled with a write-once memory device 610 comprising a controller 615 and a memory array 620 of write-once memory cells. The memory array 620 comprises at least two sections: one reserved for file system structures (file system structures section 625) and another reserved for data storage (data section 630). Additional portions of the memory array 620 can be reserved. For example, an additional portion of the memory array 620 can be reserved for pointers used to redirect memory read operations to a current file system structure, as described above. In this preferred embodiment, only the bits of the file system structure (and not the data bits) are inverted, and the data storage device 600 is responsible for inverting those bits. When the data storage device 600 sends inverted file system structure bits to the write-once memory device 610, the controller 615 stores the inverted bits in the file system structure section 625 of the memory array 620. When the data storage device 600 sends non-inverted data bits to the write-once memory device 610, the controller 615 stores the non-inverted data bits in the data section 630 of the memory array 620.

When the stored bits are read by a data reading device 640 coupled with the write-once memory device 610 (see FIG. 22), the controller 615 determines whether the bits are being read from the data section 630 or from the file system structures section 625. If the bits are being read from the data section 630, the controller 615 passes the bits to the data reading device 640 without inverting the bits. However, if the bits are being read from the file system structures section 625, the controller 615 inverts the bits, thereby providing file system structures to the data reading device 640 in their original, non-inverted configuration. The controller 615 preferably includes an inverter gate to perform the inverting operation. Because the controller 615 of the memory device 610 is responsible for inverting the inverted file system structure bits back to their original, non-inverted configuration, the write-once memory device 610 is compatible with data reading devices that are not aware that file system structures are stored in an inverted form in the memory array. This provides a high degree of interoperability with existing playback devices.

Figure 23:
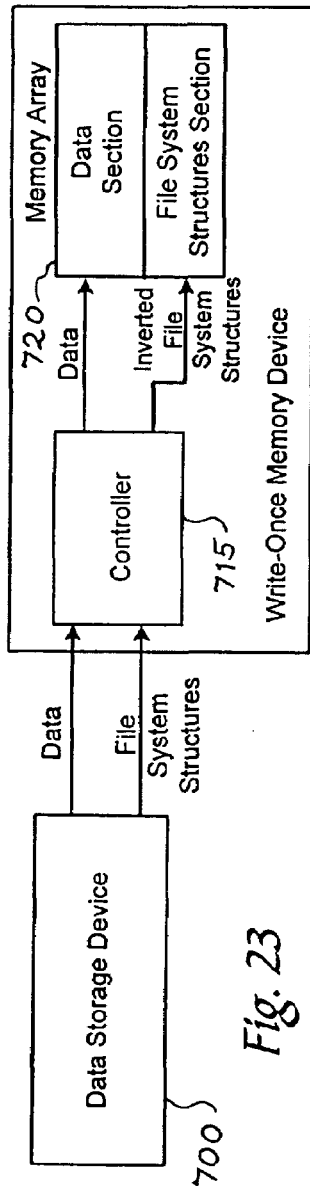
FIG. 23 is an illustration of a preferred embodiment in which a controller of a write-once memory device inverts file system structure bits to be stored in a memory array.
Figure 24:
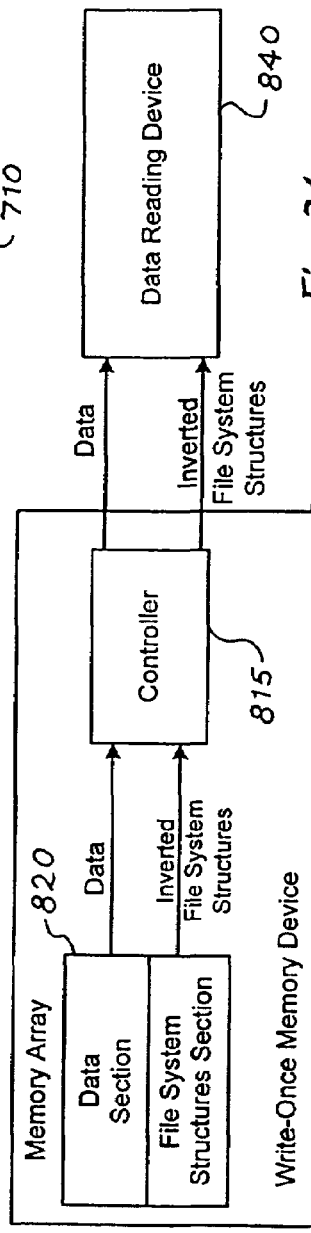
FIG. 24 is an illustration of a preferred embodiment in which a data reading device inverts file system structure bits read from a memory array.
Figure 25:
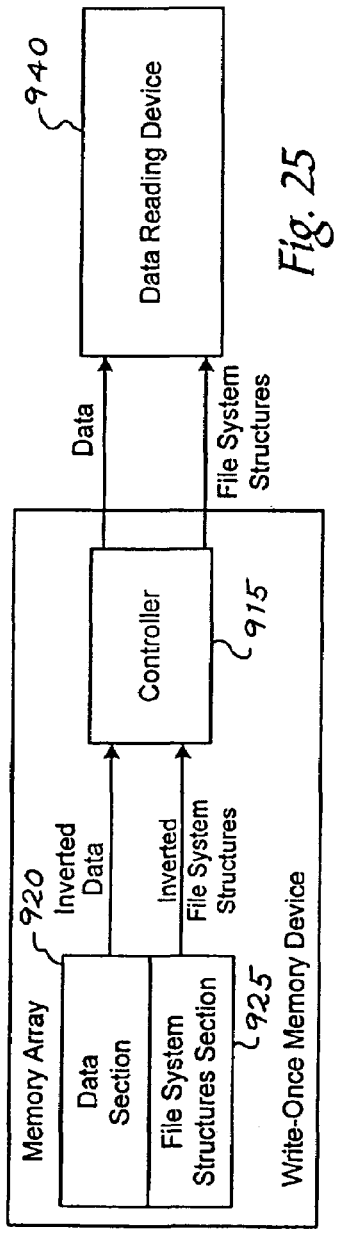
FIG. 25 is an illustration of a preferred embodiment in which a controller of a write-once memory device inverts data bits and file system structure bits read from a memory array.

In the alternate embodiment shown in FIG. 23, the controller 715 of the write-once memory device 710 (instead of the data storage device 700) is responsible for inverting file system structure bits to be stored in the memory array 720. Accordingly, in this embodiment, the controller 715 inverts file system structure bits during a write operation instead of or in addition to inverting file system structure bits during a read operation. In the alternate embodiment shown in FIG. 24, the data reading device 840 (instead of the controller 815 of the memory device 810) is responsible for inverting file system structure bits read from the memory array 820. Further, in the alternate embodiment shown in FIG. 25, instead of storing only the file system structure bits in an inverted form, all bits stored in the memory array 920 are stored in an inverted form. This results in a simplified controller 915 (or hardware/software in the data reading device 940) because all bits (not only the bits from the file system structure section 925) are inverted.

U.S. patent application Ser. No. 09/877,720, filed Jun. 8, 2001, (attorney docket no. 10519/32) contains embodiments that can be used with any of the embodiments described herein and is hereby incorporated by reference.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A method for storing and reading a file system structure in a write-once memory array, the method comprising:
   (a) inverting a plurality of bits representing a file system structure irrespective of a number of logic one bits in the plurality of bits;
   (b) storing the inverted plurality of bits in a write-once memory array;
   (c) reading the inverted plurality of bits from the write-once memory array; and
   (d) inverting the inverted plurality of bits read from the write-once memory array.

2. The method of claim 1 further comprising storing an inverted plurality of bits representing an update to the file system structure.

3. The method of claim 1, wherein act (a) is performed by a data storage device coupled with a memory device comprising the write-once memory array.

4. The method of claim 3, wherein the data storage device comprises a device selected from the group consisting of a digital audio player, a digital audio book, an electronic book, a digital camera, a game player, a general-purpose computer, a personal digital assistant, a portable telephone, a printer, and a projector.

5. The method of claim 1, wherein act (a) is performed by a controller of a memory device comprising the write-once memory array.

6. The method of claim 1, wherein act (d) is performed by a data reading device coupled with a memory device comprising the write-once memory array.

7. The method of claim 6, wherein the data reading device comprises a device selected from the group consisting of a digital audio player, a digital audio book, an electronic book, a digital camera, a game player, a general-purpose computer, a personal digital assistant, a portable telephone, a printer, and a projector.

8. The method of claim 1, wherein act (d) is performed by a controller of a memory device comprising the write-once memory array.

9. The method of claim 1, wherein the file system structure comprises a directory.

10. The method of claim 9, wherein the directory comprises a root directory.

11. The method of claim 9, wherein the directory comprises a sub-directory.

12. The method of claim 1, wherein the file system structure comprises a file allocation table.

13. A method for updating a file system structure stored in a write-once memory array, the method comprising:
   (a) creating an inverted file system structure by inverting a plurality of bits representing a file system structure irrespective of a number of logic one bits in the plurality of bits;
   (b) storing the inverted file system structure in a write-once memory array, the inverted file system structure being associated with data stored in the write-once memory array during a first session;
   (c) storing additional data in the write-once memory array during a second session; and
   (d) updating the stored inverted file system structure for the additional data stored during the second session.

14. The method of claim 13, wherein the file system structure comprises a directory.

15. The method of claim 14, wherein the directory comprises a root directory.

16. The method of claim 14, wherein the directory comprises a sub-directory.

17. The method of claim 13, wherein the file system structure comprises a file allocation table.

18. A memory device comprising:
   a write-once memory array storing a plurality of bits representing an inverted file system structure; and
   a controller coupled with the write-once memory array and operative to invert the plurality of bits representing the inverted file system structure irrespective of a number of logic one bits in the plurality of bits when the plurality of bits is read from the write-once memory array.

19. The memory device of claim 18, wherein the controller is further operative to create the inverted file system structure by inverting a plurality of bits representing a file system structure.

20. The memory device of claim 18, wherein the write-once memory array further stores a plurality of data bits, and wherein the controller does not invert the data bits when the data bits are read from the write-once memory array.

21. The memory device of claim 18, wherein the write-once memory array further stores a plurality of data bits, and wherein the controller is further operative to invert the data bits when the data bits are read from the write-once memory array.

22. The memory device of claim 18, wherein the file system structure comprises a directory.

23. The memory device of claim 22, wherein the directory comprises a root directory.

24. The memory device of claim 22, wherein the directory comprises a sub-directory.

25. The memory device of claim 18, wherein the file system structure comprises a file allocation table.

26. The memory device of claim 18, wherein the memory device comprises a solid-state memory device.

27. The memory device of claim 18, wherein the memory device comprises an optical memory device.

28. The method of claim 1 or 13, wherein the write-once memory array comprises a three-dimensional memory array.

29. The method of claim 1 or 13, wherein the write-once memory array comprises a two-dimensional memory array.

30. The memory device of claim 18, wherein the write-once memory array comprises a three-dimensional memory array.

31. The memory device of claim 18, wherein the write-once memory array comprises a two-dimensional memory array.

32. The method of claim 1, wherein the plurality of bits are inverted even when a number of logic one bits in the plurality of bits does not exceed fifty percent of a total number of bits in the plurality of bits.

33. The method of claim 13, wherein the plurality of bits are inverted even when a number of logic one bits in the plurality of bits does not exceed fifty percent of a total number of bits in the plurality of bits.

34. The memory device of claim 18, wherein the controller is operative to invert the plurality of bits even when a number of logic one bits in the plurality of bits does not exceed fifty percent of a total number of bits in the plurality of bits.

* * * * *